United States Patent
Pendharkar et al.

(10) Patent No.: US 8,598,008 B2
(45) Date of Patent: Dec. 3, 2013

(54) STACKED ESD CLAMP WITH REDUCED VARIATION IN CLAMP VOLTAGE

(75) Inventors: Sameer P. Pendharkar, Allen, TX (US); Marie Denison, Plano, TX (US); Yongxi Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 13/277,939

(22) Filed: Oct. 20, 2011

(65) Prior Publication Data

US 2012/0098098 A1    Apr. 26, 2012

Related U.S. Application Data

(60) Provisional application No. 61/394,923, filed on Oct. 20, 2010.

(51) Int. Cl.
*H01L 21/331* (2006.01)
*H01L 21/8222* (2006.01)

(52) U.S. Cl.
USPC .................. 438/309; 257/566; 257/E21.608

(58) Field of Classification Search
USPC ......... 438/309, 189, 202–205, 234–236, 313, 438/322, 329–331, 335–340; 257/566, 257/E27.055, E21.608
See application file for complete search history.

(56) References Cited

U.S. PATENT DOCUMENTS

| | | | | |
|---|---|---|---|---|
| 5,953,600 | A | * | 9/1999 | Gris ............................. 438/200 |
| 2007/0004160 | A1 | * | 1/2007 | Voldman ..................... 438/309 |
| 2007/0037355 | A1 | * | 2/2007 | Lee et al. ..................... 438/309 |

* cited by examiner

*Primary Examiner* — Chuong A Luu
*Assistant Examiner* — Nga Doan
(74) *Attorney, Agent, or Firm* — W. James Brady, III; Frederick J. Telecky, Jr.

(57) ABSTRACT

An integrated circuit containing a stacked bipolar transistor which includes two bipolar transistors connected in series is disclosed. Each bipolar transistor includes a breakdown inducing feature. The breakdown inducing features have reflection symmetry with respect to each other. A process for forming an integrated circuit containing a stacked bipolar transistor which includes two bipolar transistors connected in series, with breakdown inducing features having reflection symmetry, is also disclosed.

10 Claims, 8 Drawing Sheets ant_STACKED ESD CLAMP WITH REDUCED
VARIATION IN CLAMP VOLTAGE

This application claims the benefit of U.S. Provisional Application No. 61/394,923, filed Oct. 20, 2010, the entirety of which is herein incorporated by reference.

FIELD OF THE INVENTION

This invention relates to the field of integrated circuits. More particularly, this invention relates to bipolar transistors in integrated circuits.

BACKGROUND OF THE INVENTION

Bipolar transistors in integrated circuits may exhibit breakdown between bases and collectors of the bipolar transistors when voltages are applied to the collectors. Breakdown voltages may be sensitive to variations in locations of breakdown related elements such as collectors of the bipolar transistors with respect to the bases. Variations in the locations of the breakdown related elements between instances of the bipolar transistors may be due to alignment variations of photolithographic patterns for forming the bases and the breakdown related elements during fabrication of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may contain a stacked bipolar transistor which includes two bipolar transistors electrically connected in series. In each bipolar transistor, a breakdown inducing feature is located such that collector-base breakdown is induced to occur in areas which have reflection symmetry with respect to bases of their respective bipolar transistors. A process of forming the integrated circuit containing the stacked bipolar transistor is also disclosed.

DETAILED DESCRIPTION

Figure 1A:
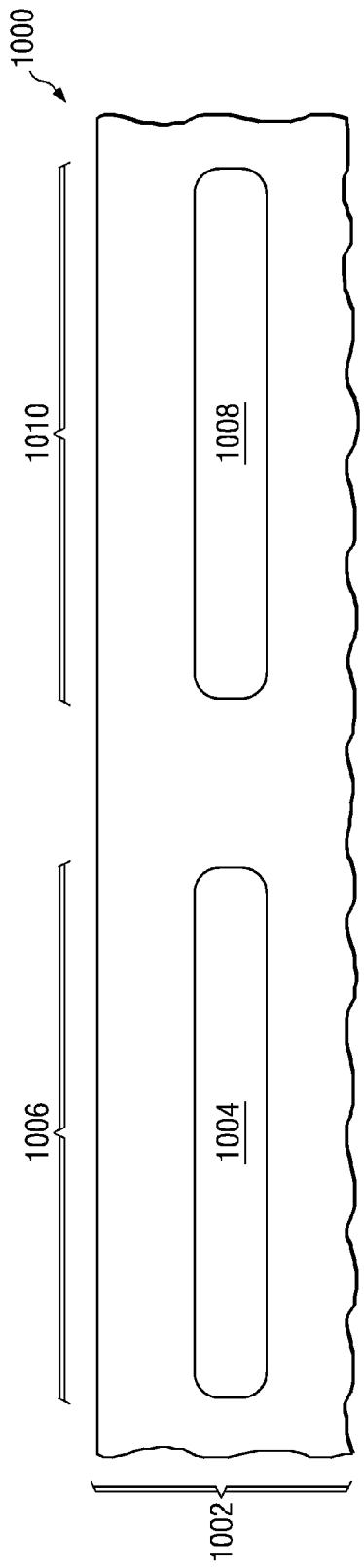
FIG. 1A through FIG. 1E are cross-sections of an integrated circuit containing a stacked bipolar transistor formed according to a first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may contain a stacked bipolar transistor which includes two bipolar transistors which have reflection symmetry with respect to each other, and are electrically connected in series. Each bipolar transistor contains a breakdown inducing feature which includes a collector and a base of the bipolar transistor, and which may induce collector-base breakdown in a breakdown region of the transistor. The breakdown inducing features and the breakdown regions have reflection symmetry with respect to bases of their respective bipolar transistors. Alignment variations during fabrication of the integrated circuit which may cause variations in locations of the breakdown inducing features with respect to the bases and collectors of their respective bipolar transistors may lead to variations in breakdown voltages of the bipolar transistors. Forming the breakdown inducing features and the breakdown regions to have reflection symmetry with respect to their respective bases may provide offsetting variations of breakdown voltages between the two bipolar transistors in the stacked bipolar transistor, and so may advantageously provide more uniformity of breakdown voltage among instances of the stacked bipolar transistor.

FIG. 1A through FIG. 1E are cross-sections of an integrated circuit containing a stacked bipolar transistor formed according to a first embodiment, depicted in successive stages of fabrication. Referring to FIG. 1A, the integrated circuit 1000 is formed in and on a semiconductor substrate 1002. The substrate 1002 may be a single crystal silicon wafer, a silicon-on-insulator (SOI) wafer, a hybrid orientation technology (HOT) wafer with regions of different crystal orientations, or other material appropriate for fabrication of the integrated circuit 1000. A first buried collector layer 1004 is formed in the substrate 1002 in a first bipolar transistor area 1006. A second buried collector layer 1008 is formed in the substrate 1002 in a second bipolar transistor area 1010. In the instant embodiment, the substrate 1002 in the first bipolar transistor area 1006 and in the second bipolar transistor area 1010 is p-type, while the buried collectors 1004 and 1008 are n-type. In one realization of the instant embodiment, the buried collectors 1004 and 1008 may be formed by diffusing or ion implanting n-type dopants such as phosphorus, arsenic or antimony in areas defined for the buried collectors 1004 and 1008 and growing epitaxial semiconductor material over the implanted regions. In an alternate realization of the instant embodiment, the buried collectors 1004 and 1008 may be formed by ion implanting n-type dopants into the substrate 1002 with sufficient energy to form n-type layers at a desired depth below a top surface of the substrate 1002. Other processes of forming the buried collectors 1004 and 1008 are within the scope of the instant embodiment.

Figure 1B:
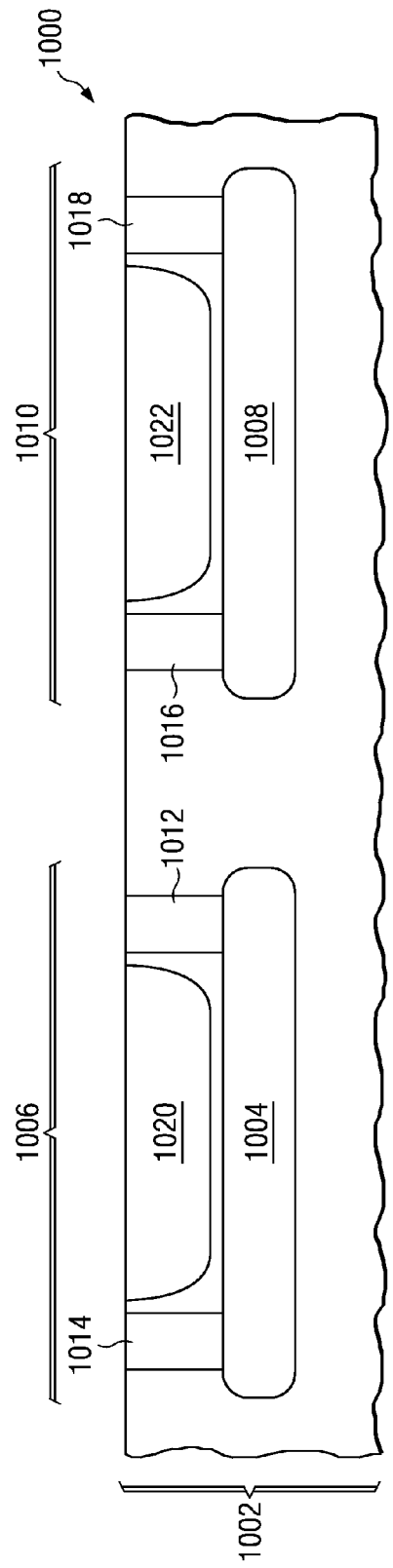

Referring to FIG. 1B, a first collector right vertical member 1012 is formed in the substrate 1002, extending from a top surface of the substrate 1002 to the first buried collector layer 1004. A first collector left vertical member 1014 is formed in the substrate 1002, also extending from a top surface of the substrate 1002 to the first buried collector layer 1004. The first collector left vertical member 1014 is laterally separated from the first collector right vertical member 1012. The first collector right vertical member 1012 and the first collector left vertical member 1014 have a same conductivity type as the first buried collector layer 1004.

A second collector left vertical member 1016 and a second collector right vertical member 1018 are formed in the substrate 1002, also extending from a top surface of the substrate 1002 to the second buried collector layer 1008. The second collector left vertical member 1016 and the second collector right vertical member 1018 are located so as to have reflection symmetry with respect to the first collector right vertical member 1012 and the first collector left vertical member 1014, respectively; that is, a lateral direction from the first collector right vertical member 1012 to the first collector left vertical member 1014 is opposite a lateral direction from the second collector left vertical member 1016 to the second collector right vertical member 1018. A plane of the reflection symmetry is perpendicular to the top surface of the substrate 1002 and perpendicular to the plane of FIG. 1B. In the instant embodiment, a lateral separation between the second collector left vertical member 1016 and the second collector right vertical member 1018 is substantially equal to a lateral separation between the first collector right vertical member 1012 and the first collector left vertical member 1014.

An optional first well 1020 may be formed between the first collector right vertical member 1012 and the first collector left vertical member 1014, above the first buried collector layer 1004 extending to the top surface of the substrate 1002. A conductivity type of the first well 1020 if formed is opposite from the conductivity type of the first buried collector layer 1004. An optional second well 1022 may be formed between the second collector left vertical member 1016 and the second collector right vertical member 1018, above the second buried collector layer 1008 extending to the top surface of the substrate 1002. A conductivity type of the second well 1022 if formed is opposite from the conductivity type of the second buried collector layer 1008.

Figure 1C:
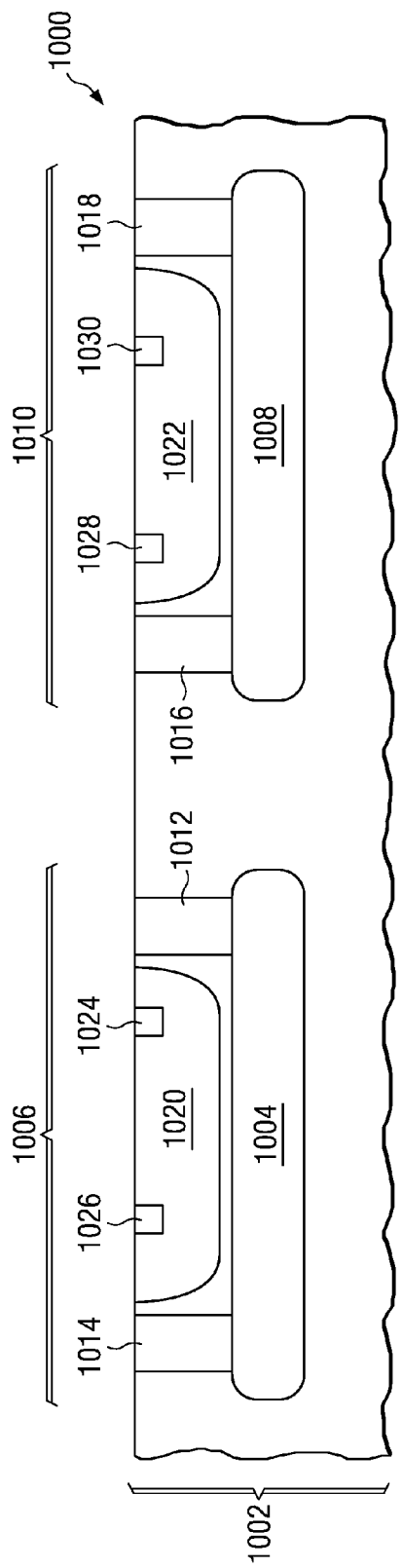

Referring to FIG. 1C, a first base right diffused region 1024 is formed in the substrate 1002, extending to the top surface of the substrate 1002, between the first collector right vertical member 1012 and the first collector left vertical member 1014. The first base right diffused region 1024 is located closer to the first collector right vertical member 1012 than to the first collector left vertical member 1014.

A first base left diffused region 1026 is formed in the substrate 1002, extending to the top surface of the substrate 1002, between the first collector right vertical member 1012 and the first collector left vertical member 1014. The first base left diffused region 1026 is located closer to the first collector left vertical member 1014 than to the first collector right vertical member 1012. In the instant embodiment, a lateral separation between the first base right diffused region 1024 and the first collector right vertical member 1012 is less than a lateral separation between the first base left diffused region 1026 and the first collector left vertical member 1014. In one realization of the instant embodiment, the lateral separation between the first base right diffused region 1024 and the first collector right vertical member 1012 is between 0.75 and 0.85 microns less than the lateral separation between the first base left diffused region 1026 and the first collector left vertical member 1014.

A second base left diffused region 1028 and a second base right diffused region 1030 are formed in the substrate 1002, extending to the top surface of the substrate 1002, between the second collector left vertical member 1016 and the second collector right vertical member 1018. The second base left diffused region 1028 is located closer to the second collector left vertical member 1016 than to the second collector right vertical member 1018. The second base right diffused region 1030 is located closer to the second collector right vertical member 1018 than to the second collector left vertical member 1016. In the instant embodiment, a lateral separation between the second base left diffused region 1028 and the second collector left vertical member 1016 is less than a lateral separation between the second base right diffused region 1030 and the second collector right vertical member 1018. in the instant embodiment, the lateral separation between the second base left diffused region 1028 and the second collector left vertical member 1016 is substantially equal to the lateral separation between the first base right diffused region 1024 and the first collector right vertical member 1012.

The base diffused regions 1024, 1026, 1028 and 1030 have a conductivity type opposite from the collector vertical members 1012, 1014, 1016 and 1018. The base diffused regions 1024, 1026, 1028 and 1030 may be formed for example by ion implanting dopants into the substrate 1002 in areas defined for the base diffused regions 1024, 1026, 1028 and 1030 by a base diffused region photoresist pattern (not shown), and subsequently annealing the substrate 1002.

Figure 1D:
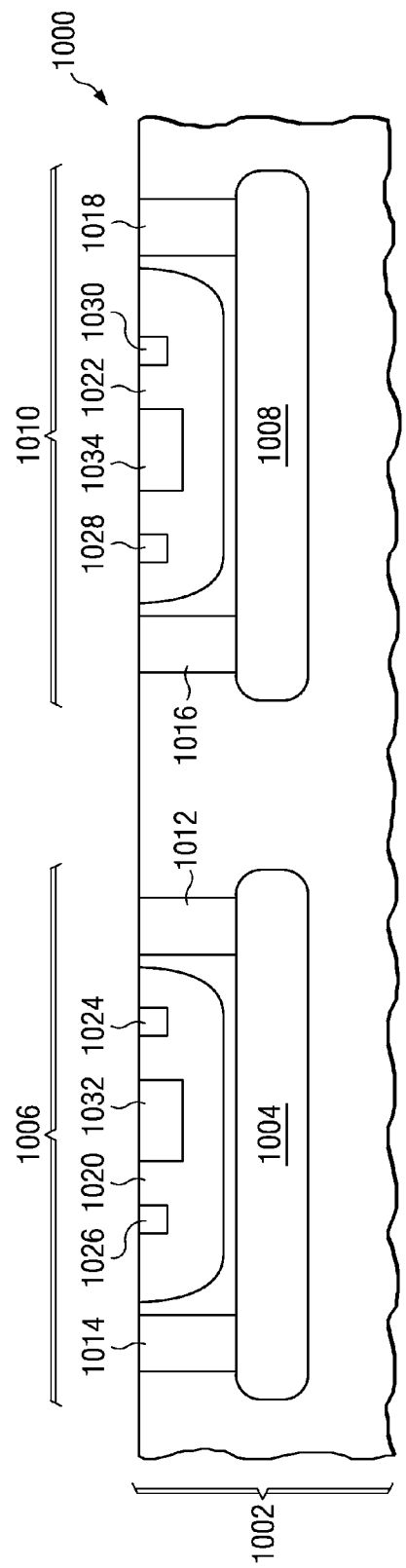

Referring to FIG. 1D, a first emitter diffused region 1032 is formed in the substrate 1002 extending to the top surface of the substrate 1002 between the first base right diffused region 1024 and the first base left diffused region 1026. In the instant embodiment, the first emitter diffused region 1032 is located substantially equidistant from the first base right diffused region 1024 and the first base left diffused region 1026.

A second emitter diffused region 1034 is formed in the substrate 1002 extending to the top surface of the substrate 1002 between the second base left diffused region 1028 and the second base right diffused region 1030. In the instant embodiment, the second emitter diffused region 1034 is located substantially equidistant from the second base left diffused region 1028 and the second base right diffused region 1030.

The emitter diffused regions 1032 and 1034 have a same conductivity type as the collector vertical members 1012, 1014, 1016 and 1018. The emitter diffused regions 1032 and 1034 may be formed for example by ion implanting dopants into the substrate 1002 in areas defined for the emitter diffused regions 1032 and 1034 by an emitter diffused region photoresist pattern (not shown), and subsequently annealing the substrate 1002. Regions of the substrate 1002 between the emitter diffused regions 1032 and 1034 and the first bipolar transistor area 1006 and the second bipolar transistor area 1010 may be further modified by introducing additional dopants, for example by ion implanting dopants followed by one or more subsequent anneal processes.

The first buried collector layer 1004, the first collector right vertical member 1012 and the first collector left vertical member 1014 are included in a collector of the first bipolar transistor. The first base right diffused region 1024 and the first base left diffused region 1026 are included in a base of the first bipolar transistor. The first emitter diffused region 1032 is included in an emitter of the first bipolar transistor. Similarly, the second buried collector layer 1008, the second collector left vertical member 1016 and the second collector right vertical member 1018 are included in a collector of the second bipolar transistor. The second base left diffused region 1028 and the second base right diffused region 1030 are included in a base of the second bipolar transistor. The second emitter diffused region 1034 is included in an emitter of the second bipolar transistor.

Figure 1E:
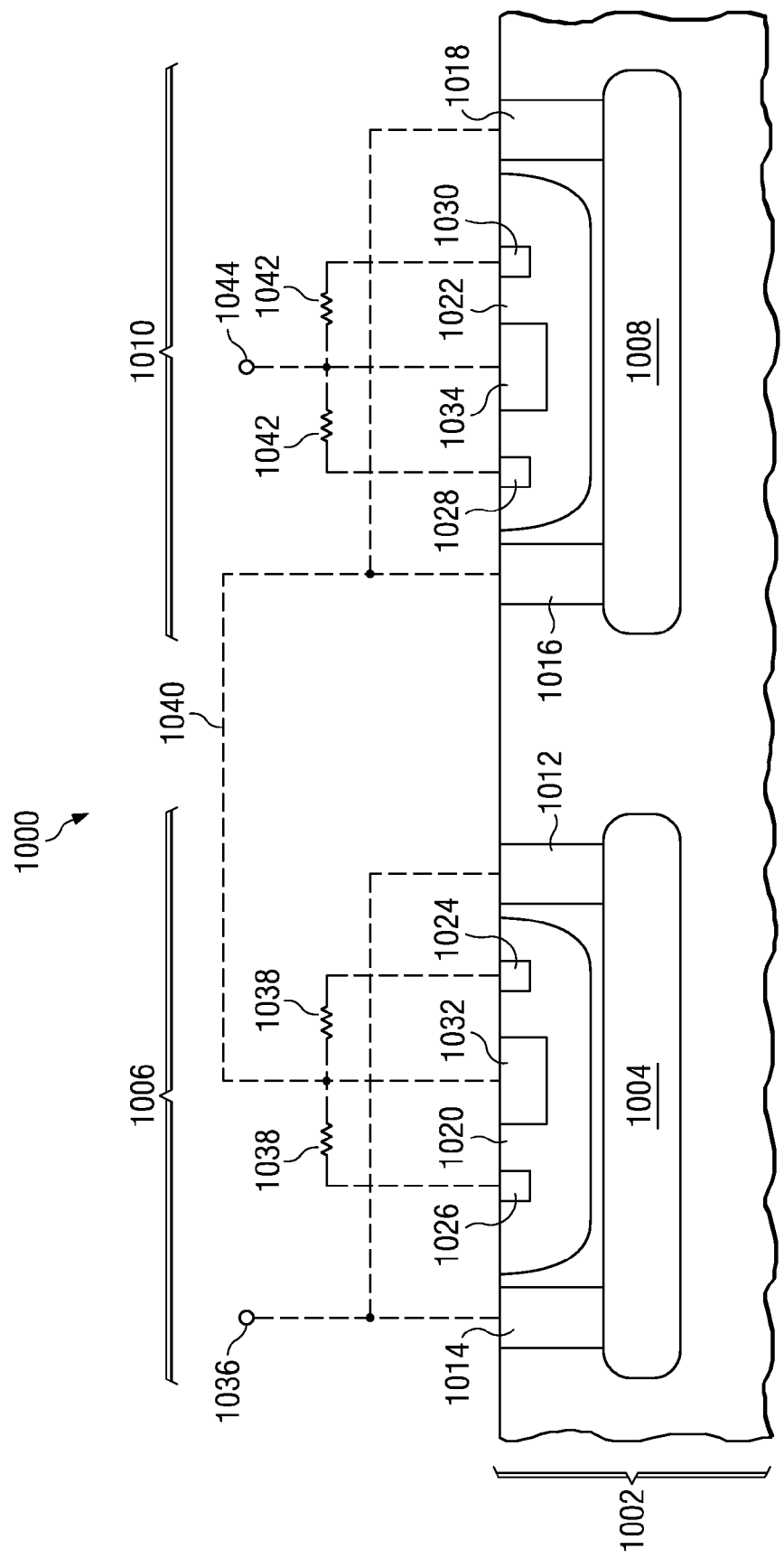

In the instant embodiment, the first bipolar transistor and the second bipolar transistor may be electrically coupled in series as depicted in FIG. 1E to form the stacked bipolar transistor. The first collector right vertical member 1012 and the first collector left vertical member 1014 may be coupled to a first circuit node 1036. The first base right diffused region 1024 and the first base left diffused region 1026 may be coupled to the first emitter diffused region 1032, possibly through optional first resistors 1038. The first emitter diffused region 1032 may be coupled to the second collector left vertical member 1016 and the second collector right vertical member 1018 for example through interconnect elements of the integrated circuit 1000 as depicted schematically by transistor connection 1040. The second base left diffused region 1028 and the second base right diffused region 1030 may be coupled to the second emitter diffused region 1034, possibly through optional second resistors 1042. The second emitter diffused region 1034 may be coupled to a second circuit node 1044.

During operation of the integrated circuit 1000, a voltage may be applied to the first circuit node 1036, for example an electro-static discharge (ESD) event, which causes collector-base breakdown in the stacked bipolar transistor. Forming the first collector right vertical member 1012, the first collector left vertical member 1014, the first base right diffused region 1024 and the first base left diffused region 1026 so that the lateral separation between the first base right diffused region 1024 and the first collector right vertical member 1012 is less than the lateral separation between the first base left diffused region 1026 and the first collector left vertical member 1014 may cause collector-base breakdown in the first bipolar transistor to be induced in a region between the first base right diffused region 1024 and the first collector right vertical member 1012. The configuration of the first base right diffused region 1024 and the first collector right vertical member 1012 is a breakdown inducing feature of the first bipolar transistor. Similarly, forming the second collector left vertical member 1016, the second collector right vertical member 1018, the second base left diffused region 1028 and the second base right diffused region 1030 so that the lateral separation between the second base left diffused region 1028 and the second collector left vertical member 1016 is less than the lateral separation between the second base right diffused region 1030 and the second collector right vertical member 1018 may cause breakdown in the second bipolar transistor to be induced in a region between the second base left diffused region 1028 and the second collector left vertical member 1016. The configuration of the second base left diffused region 1028 and the second collector left vertical member 1016 is a breakdown inducing feature of the second bipolar transistor. Forming the first bipolar transistor and the second bipolar transistor as described in reference to FIG. 1A through FIG. 1D results in the breakdown inducing feature of the second bipolar transistor having reflection symmetry with respect to the breakdown inducing feature of the first bipolar transistor. A plane of the reflection symmetry is perpendicular to the top surface of the substrate 1002 and perpendicular to the planes of FIG. 1A through FIG. 1D.

A first collector-base breakdown voltage of the collector-base breakdown between the first base right diffused region 1024 and the first collector right vertical member 1012 may be an increasing function of the lateral separation between the first base right diffused region 1024 and the first collector right vertical member 1012, that is, larger instances of the lateral separation between the first base right diffused region 1024 and the first collector right vertical member 1012 provide larger values of the first collector-base breakdown voltage. Instances of the lateral separation between the first base right diffused region 1024 and the first collector right vertical member 1012 may include unintentional alignment variations, commonly known as misalignments, in instances of the stacked bipolar transistor. Similarly, a second collector-base breakdown voltage of the collector-base breakdown between the second base left diffused region 1028 and the second collector left vertical member 1016 may be an increasing function of the lateral separation between the second base left diffused region 1028 and the second collector left vertical member 1016. The lateral separation between the second base left diffused region 1028 and the second collector left vertical member 1016 may include the same misalignment as the lateral separation between the first base right diffused region 1024 and the first collector right vertical member 1012. In such a case, a misalignment which increases the lateral separation between the first base right diffused region 1024 and the first collector right vertical member 1012 and so increases the first collector-base breakdown voltage, may decrease the lateral separation between the second base left diffused region 1028 and the second collector left vertical member 1016 by substantially a same lateral distance and so may decrease the second collector-base breakdown voltage. A collector-base breakdown voltage of the stacked bipolar transistor is substantially a sum of the first collector-base breakdown voltage and the second collector-base breakdown voltage. Thus, forming the breakdown inducing feature of the second bipolar transistor to have reflection symmetry with respect to the breakdown inducing feature of the first bipolar transistor may reduce a sensitivity of the collector-base breakdown voltage of the stacked bipolar transistor to the misalignments.

It will be recognized that a stacked bipolar transistor of opposite polarity to that described in reference to FIG. 1A through FIG. 1E may be formed by appropriate changes in polarities of dopants and conductivity types. A stacked bipolar transistor of opposite polarity may have a reduced sensitivity of a collector-base breakdown voltage of the stacked bipolar transistor to misalignments of collector vertical members and base diffused regions, as described in reference to FIG. 1E.

In one realization of the instant embodiment, the first collector left vertical member 1014 and the second collector right vertical member 1018 may be omitted. In one realization of the instant embodiment, the first base left diffused region 1026 and the second base right diffused region 1030 may be omitted.

Figure 2:
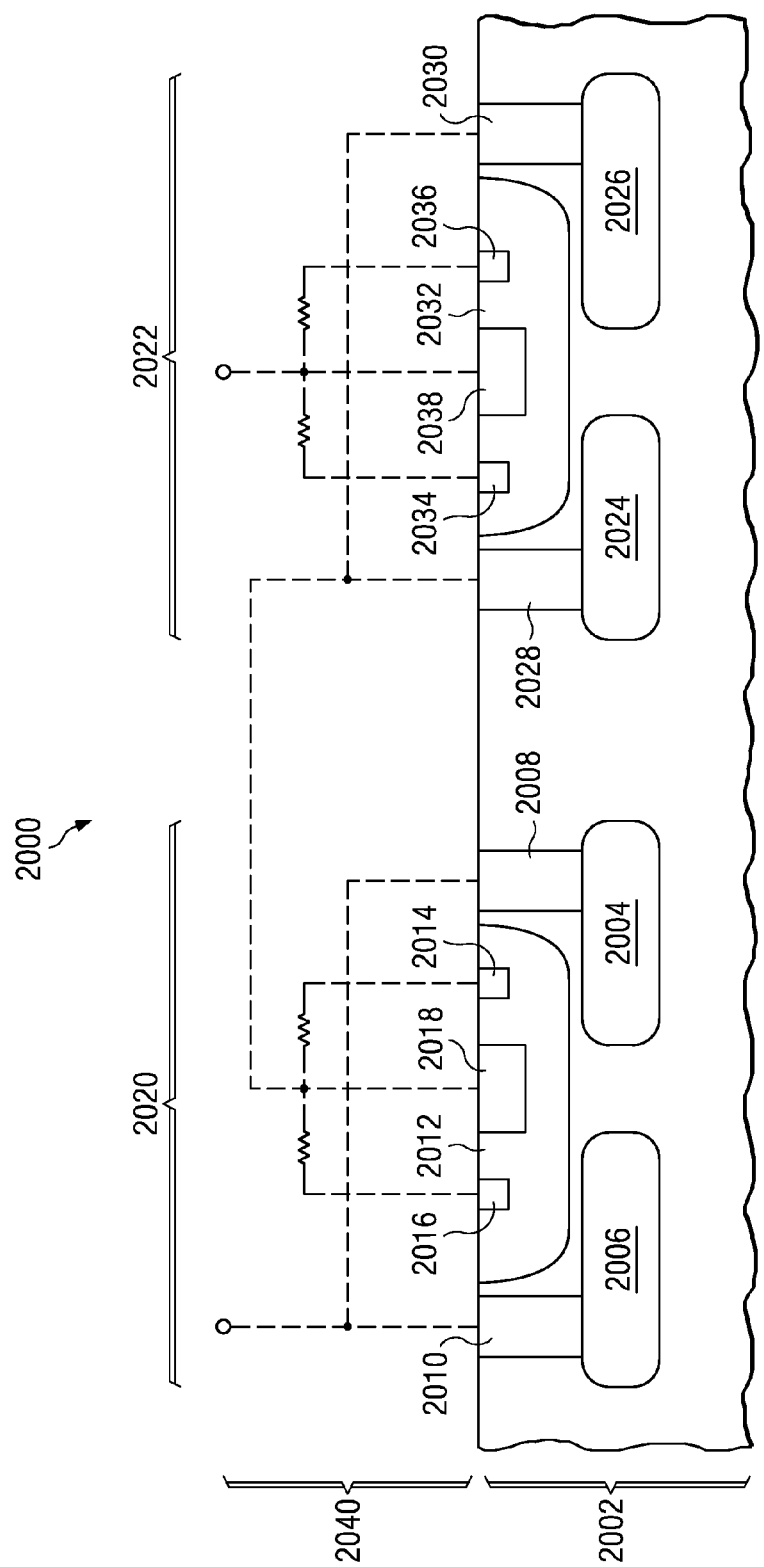
FIG. 2 is a cross-section of an integrated circuit containing a stacked bipolar transistor formed according to a second embodiment.

FIG. 2 is a cross-section of an integrated circuit containing a stacked bipolar transistor formed according to a second embodiment. The integrated circuit 2000 is formed in and on a semiconductor substrate 2002, as described in reference to FIG. 1A. An optional first buried collector right lobe 2004 and an optional first buried collector left lobe 2006 may be formed in the substrate 2002 as described in reference to the first buried collector layer 1004 in FIG. 1A. A first collector right vertical member 2008 and a first collector left vertical member 2010 are formed in the substrate 2002 and extend from a top surface of the substrate 2002 to the first buried collector right lobe 2004 and the first buried collector left lobe 2006, if present, respectively. The first collector right vertical member 2008 and the first collector left vertical member 2010 are formed as described in reference to FIG. 1B. A first well 2012 is formed between the first collector right vertical member 2008 and the first collector left vertical member 2010, above the first buried collector right lobe 2004 and the first buried collector left lobe 2006 if present, extending to the top surface of the substrate 2002. A conductivity type of the first well 2012 is opposite from a conductivity type of the first collector right vertical member 2008 and the first collector left vertical member 2010.

A first base right diffused region 2014 and a first base left diffused region 2016 are formed in the substrate 2002 between the first collector right vertical member 2008 and the first collector left vertical member 2010, using processes as described in reference to FIG. 1C. The first base right diffused region 2014 is located closer to the first collector right vertical member 2008 than to the first collector left vertical member 2010. The first base left diffused region 2016 is located closer to the first collector left vertical member 2010 than to the first collector right vertical member 2008. In the instant embodiment, a lateral separation between the first base right diffused region 2014 and the first collector right vertical member 2008 is less than a lateral separation between the first base left diffused region 2016 and the first collector left vertical member 2010. In one realization of the instant embodiment, the lateral separation between the first base right diffused region 2014 and the first collector right vertical member 2008 is between 0.75 and 0.85 microns less than the lateral separation between the first base left diffused region 2016 and the first collector left vertical member 2010.

A first emitter diffused region 2018 is formed in the substrate 2002 extending to the top surface of the substrate 2002 between the first base right diffused region 2014 and the first base left diffused region 2016. In the instant embodiment, the first emitter diffused region 2018 is located substantially equidistant from the first base right diffused region 2014 and the first base left diffused region 2016. The first buried collector right lobe 2004, the first buried collector left lobe 2006, the first collector right vertical member 2008, the first collector left vertical member 2010, the first base right diffused region 2014, the first base left diffused region 2016 and the first emitter diffused region 2018 are included in a first bipolar transistor 2020 of the stacked bipolar transistor.

A second bipolar transistor 2022 of the stacked bipolar transistor includes a second buried collector left lobe 2024 and a second buried collector right lobe 2026 if the optional first buried collector lobes 2004 and 2006 are present, and includes a second collector left vertical member 2028, a second collector right vertical member 2030, a second well 2032, a second base left diffused region 2034, a second base right diffused region 2036 and a second emitter diffused region 2038. The second buried collector left lobe 2024 and the second buried collector right lobe 2026, if present, are located so as to have reflection symmetry with respect to the first buried collector right lobe 2004 and the first buried collector left lobe 2006, respectively. Similarly, the second collector left vertical member 2028 and the second collector right vertical member 2030 are located so as to have reflection symmetry with respect to the first collector right vertical member 2008 and the first collector left vertical member 2010, respectively. Similarly, the second base left diffused region 2034 and the second base right diffused region 2036 are located so as to have reflection symmetry with respect to the first base right diffused region 2014 and the first base left diffused region 2016, respectively. A plane of the reflection symmetry is perpendicular to the top surface of the substrate 2002 and perpendicular to the plane of FIG. 2. A lateral separation between the second base left diffused region 2034 and the second collector left vertical member 2028 is substantially equal to the lateral separation between the first base right diffused region 2014 and the first collector right vertical member 2008.

The optional first buried collector right lobe 2004 if present, the optional first buried collector left lobe 2006 if present, the first collector right vertical member 2008 and the first collector left vertical member 2010 are included in a collector of the first bipolar transistor 2020. The first base right diffused region 2014 and the first base left diffused region 2016 are included in a base of the first bipolar transistor 2020. The first emitter diffused region 2018 is included in an emitter of the first bipolar transistor 2020. Similarly, the second buried collector left lobe 2024 if present, the second buried collector right lobe 2026 if present, the second collector left vertical member 2028 and the second collector right vertical member 2030 are included in a collector of the second bipolar transistor 2022. The second base left diffused region 2034 and the second base right diffused region 2036 are included in a base of the second bipolar transistor 2022. The second emitter diffused region 2038 is included in an emitter of the second bipolar transistor 2022.

The first bipolar transistor 2020 and the second bipolar transistor 2022 may be electrically coupled in series by interconnect elements 2040 as described in reference to FIG. 1E. The configuration of the first base right diffused region 2014 and the first collector right vertical member 2008 is a breakdown inducing feature of the first bipolar transistor. Similarly, the configuration of the second base left diffused region 2034 and the second collector left vertical member 2028 is a breakdown inducing feature of the second bipolar transistor. Forming the breakdown inducing feature of the second bipolar transistor 2022 to have reflection symmetry with respect to the breakdown inducing feature of the first bipolar transistor 2020 may reduce a sensitivity of a collector-base breakdown voltage of the stacked bipolar transistor to misalignments of the collector vertical members 2008, 2010, 2028 and 2030 and the base diffused regions 2014, 2016, 2032 and 2034, as described in reference to FIG. 1E. In the instant embodiment, locations of the first buried collector lobes 2004 and 2006 if present may be adjusted to provide balanced bipolar current density in the first bipolar transistor 2020 in view of the difference in lateral separations between the first base diffused regions 2014 and 2016 and the first collector vertical members 2008 and 2010. Similarly, locations of the second buried collector lobes 2024 and 2026 if present may be adjusted to provide balanced bipolar current density in the second bipolar transistor 2022 in view of the difference in lateral separations between the second base diffused regions 2032 and 2034 and the second collector vertical members 2028 and 2030.

It will be recognized that a stacked bipolar transistor of opposite polarity to that described in reference to FIG. 2 may be formed by appropriate changes in polarities of dopants and conductivity types. A stacked bipolar transistor of opposite polarity may have a reduced sensitivity of a collector-base breakdown voltage of the stacked bipolar transistor to misalignments of collector vertical members and base diffused regions, as described in reference to FIG. 2.

In one realization of the instant embodiment, the first collector left vertical member 2010, the first buried collector left lobe 2006, the second collector right vertical member 2030 and the second buried collector right lobe 2026 may be omitted. In one realization of the instant embodiment, the first base left diffused region 2016 and the second base right diffused region 2036 may be omitted.

Figure 3:
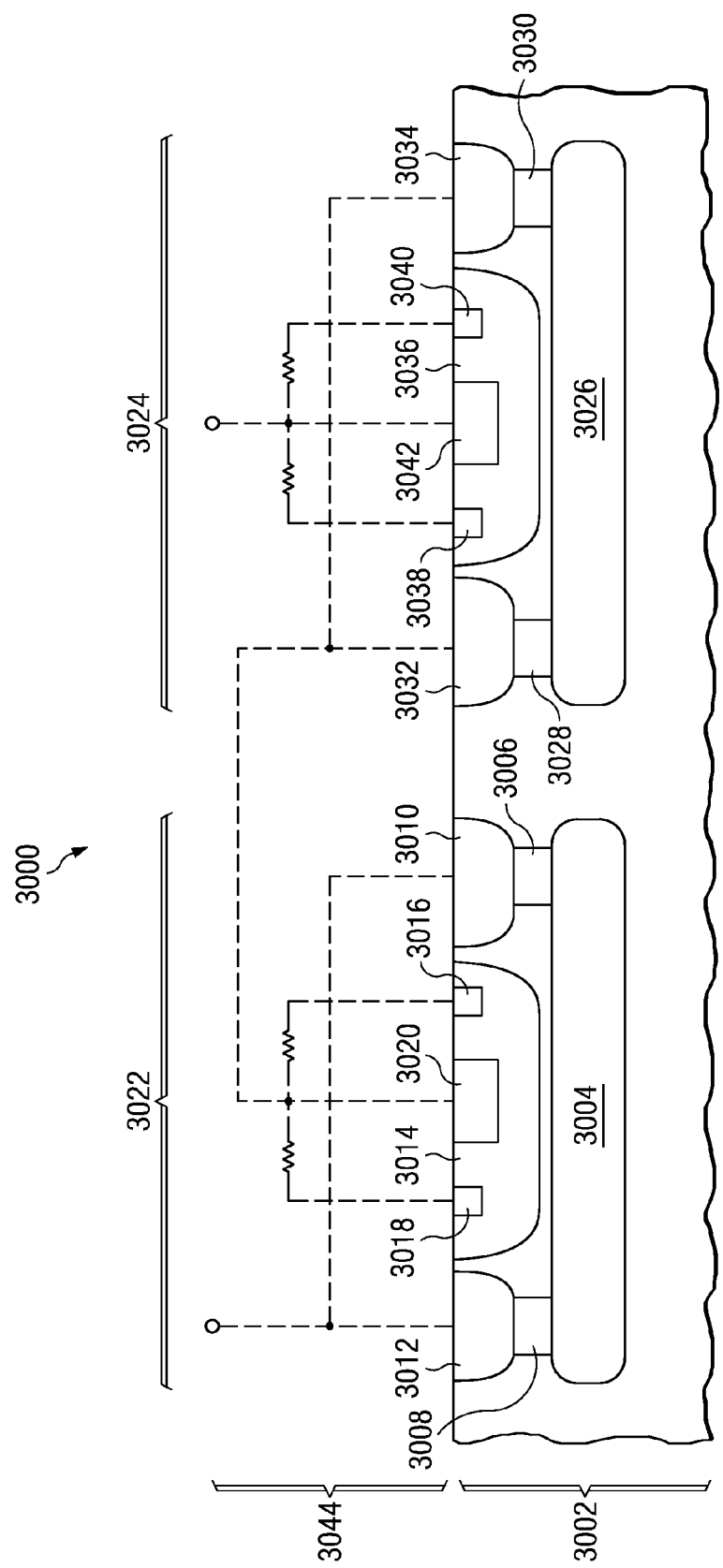
FIG. 3 is a cross-section of an integrated circuit containing a stacked bipolar transistor formed according to a third embodiment.

FIG. 3 is a cross-section of an integrated circuit containing a stacked bipolar transistor formed according to a third embodiment. The integrated circuit 3000 is formed in and on a semiconductor substrate 3002, as described in reference to FIG. 1A. An optional first buried collector layer 3004 may be formed in the substrate 3002 as described in reference to FIG. 1A. A first collector right vertical member 3006 and a first collector left vertical member 3008 are formed in the substrate 3002 and extend to the first buried collector layer 3004 if present. The first collector right vertical member 3006 and the first collector left vertical member 3008 are formed as described in reference to FIG. 1B.

A first collector right shallow well 3010 is formed in the substrate 3002, extending from a top surface of the substrate 3002 to the first collector right vertical member 3006. Similarly, a first collector left shallow well 3012 is formed in the substrate 3002, extending from the top surface of the substrate 3002 to the first collector left vertical member 3008. The first collector right shallow well 3010 and the first collector left shallow well 3012 have a same conductivity type as the first collector right vertical member 3006. A lateral boundary of the first collector right shallow well 3010 on a side closest to the first collector left shallow well 3012 extends past a corresponding lateral boundary of the first collector right vertical member 3006. A lateral boundary of the first collector left shallow well 3012 on a side closest to the first collector right shallow well 3010 extends past a corresponding lateral boundary of the first collector left vertical member 3008. An optional first well 3014 may be formed between the first collector right vertical member 3006 and the first collector left vertical member 3008, above the first buried collector layer 3004 if present and extending to the top surface of the substrate 3002. A conductivity type of the first well 3014 if formed is opposite from a conductivity type of the first collector right shallow well 3010 and the first collector left shallow well 3012.

A first base right diffused region 3016 and a first base left diffused region 3018 are formed in the substrate 3002 between the first collector right shallow well 3010 and the first collector left shallow well 3012, using processes as described in reference to FIG. 1C. The first base right diffused region 3016 is located closer to the first collector right shallow well 3010 than to the first collector left shallow well 3012. The first base left diffused region 3018 is located closer to the first collector left shallow well 3012 than to the first collector right shallow well 3010. In the instant embodiment, a lateral separation between the first base right diffused region 3016 and the first collector right shallow well 3010 is less than a lateral separation between the first base left diffused region 3018 and the first collector left shallow well 3012. In one realization of the instant embodiment, the lateral separation between the first base right diffused region 3016 and the first collector right shallow well 3010 is between 0.75 and 0.85 microns less than the lateral separation between the first base left diffused region 3018 and the first collector left shallow well 3012.

A first emitter diffused region 3020 is formed in the substrate 3002 extending to the top surface of the substrate 3002 between the first base right diffused region 3016 and the first base left diffused region 3018. In the instant embodiment, the first emitter diffused region 3020 is located substantially equidistant from the first base right diffused region 3016 and the first base left diffused region 3018. The optional buried collector layer 3004 if present, the first collector right vertical member 3006, the first collector left vertical member 3008, the first collector right shallow well 3010, the first collector left shallow well 3012, the first base right diffused region 3016, the first base left diffused region 3018 and the first emitter diffused region 3020 are included in a first bipolar transistor 3022 of the stacked bipolar transistor.

A second bipolar transistor 3024 of the stacked bipolar transistor includes a second buried collector layer 3026 if the optional first buried collector layer 3004 is present, and includes a second collector left vertical member 3028, a second collector right vertical member 3030, a second collector left shallow well 3032, a second collector right shallow well 3034, an optional second well 3036, a second base left diffused region 3038, a second base right diffused region 3040 and a second emitter diffused region 3042. The second collector left shallow well 3032 and the second collector right shallow well 3034 are located so as to have reflection symmetry with respect to the first collector right shallow well 3010 and the first collector left shallow well 3012, respectively. Similarly, the second base left diffused region 3038 and the second base right diffused region 3040 are located so as to have reflection symmetry with respect to the first base right diffused region 3016 and the first base left diffused region 3018, respectively. A plane of the reflection symmetry is perpendicular to the top surface of the substrate 3002 and perpendicular to the plane of FIG. 3. A lateral separation between the second base left diffused region 3038 and the second collector left shallow well 3032 is substantially equal to the lateral separation between the first base right diffused region 3016 and the first collector right shallow well 3010. The first bipolar transistor 3022 and the second bipolar transistor 3024 may be electrically coupled in series by interconnect elements 3044 as described in reference to FIG. 1E.

The optional first buried collector layer 3004 if present, the first collector right vertical member 3006, the first collector left vertical member 3008, the first collector right shallow well 3010 and first collector left shallow well 3012 are included in a collector of the first bipolar transistor 3022. The first base right diffused region 3016 and the first base left diffused region 3018 are included in a base of the first bipolar transistor 3022. The first emitter diffused region 3020 is included in an emitter of the first bipolar transistor 3022. Similarly, the second buried collector layer 3026 if present, the second collector left vertical member 3028, the second collector right vertical member 3030, the second collector left shallow well 3032 and the second collector right shallow well 3034 are included in a collector of the second bipolar transistor 3024. The second base left diffused region 3038 and the second base right diffused region 3040 are included in a base of the second bipolar transistor 3024. The second emitter diffused region 3042 is included in an emitter of the second bipolar transistor 3024.

Forming the first collector right shallow well 3010, the first collector left shallow well 3012, the first base right diffused region 3016 and the first base left diffused region 3018 so that the lateral separation between the first base right diffused region 3016 and the first collector right shallow well 3010 is less than the lateral separation between the first base left diffused region 3018 and the first collector left shallow well 3012 may cause collector-base breakdown in the first bipolar transistor 3022 to be induced in a region between the first base right diffused region 3016 and the first collector right shallow well 3010. The configuration of the first base right diffused region 3016 and the first collector right shallow well 3010 is a breakdown inducing feature of the first bipolar transistor. Similarly, forming the second collector left shallow well 3032, the second collector right shallow well 3034, the second base left diffused region 3038 and the second base right diffused region 3040 so that the lateral separation between the second base left diffused region 3038 and the second collector left shallow well 3032 is less than the lateral separation between the second base right diffused region 3040 and the second collector right shallow well 3034 may cause breakdown in the second bipolar transistor 3024 to be induced in a region between the second base left diffused region 3038 and the second collector left shallow well 3032. The configuration of the second base left diffused region 3038 and the second collector left shallow well 3032 is a breakdown inducing feature of the second bipolar transistor.

A first collector-base breakdown voltage of the collector-base breakdown between the first base right diffused region 3016 and the first collector right shallow well 3010 may be an increasing function of the lateral separation between the first base right diffused region 3016 and the first collector right shallow well 3010. Instances of the lateral separation between the first base right diffused region 3016 and the first collector right shallow well 3010 may include misalignments in instances of the stacked bipolar transistor. Similarly, a second collector-base breakdown voltage of the collector-base breakdown between the second base left diffused region 3038 and the second collector left shallow well 3032 may be an increasing function of the lateral separation between the second base left diffused region 3038 and the second collector left shallow well 3032. The lateral separation between the second base left diffused region 3038 and the second collector left shallow well 3032 may include the same misalignment as the lateral separation between the first base right diffused region 3016 and the first collector right shallow well 3010. In such a case, a misalignment which increases the lateral separation between the first base right diffused region 3016 and the first collector right shallow well 3010 and so increases the first collector-base breakdown voltage, may decrease the lateral separation between the second base left diffused region 3038 and the second collector left shallow well 3032 by substantially a same lateral distance and so may decrease the second collector-base breakdown voltage. A collector-base breakdown voltage of the stacked bipolar transistor is substantially a sum of the first collector-base breakdown voltage and the second collector-base breakdown voltage. Thus, forming the breakdown inducing feature of the second bipolar transistor 3024 to have reflection symmetry with respect to the breakdown inducing feature of the first bipolar transistor 3022 may reduce a sensitivity of the collector-base breakdown voltage of the stacked bipolar transistor to the misalignments.

It will be recognized that a stacked bipolar transistor of opposite polarity to that described in reference to FIG. 3 may be formed by appropriate changes in polarities of dopants and conductivity types. A stacked bipolar transistor of opposite polarity may have a reduced sensitivity of a collector-base breakdown voltage of the stacked bipolar transistor to misalignments of collector shallow wells and base diffused regions, as described in reference to FIG. 3.

In one realization of the instant embodiment, the first collector left vertical member 3008, the first collector left shallow well 3012, the second collector right vertical member 3030 and the second collector right shallow well 3034 may be omitted. In one realization of the instant embodiment, the first base left diffused region 3018 and the second base right diffused region 3040 may be omitted.

Figure 4:
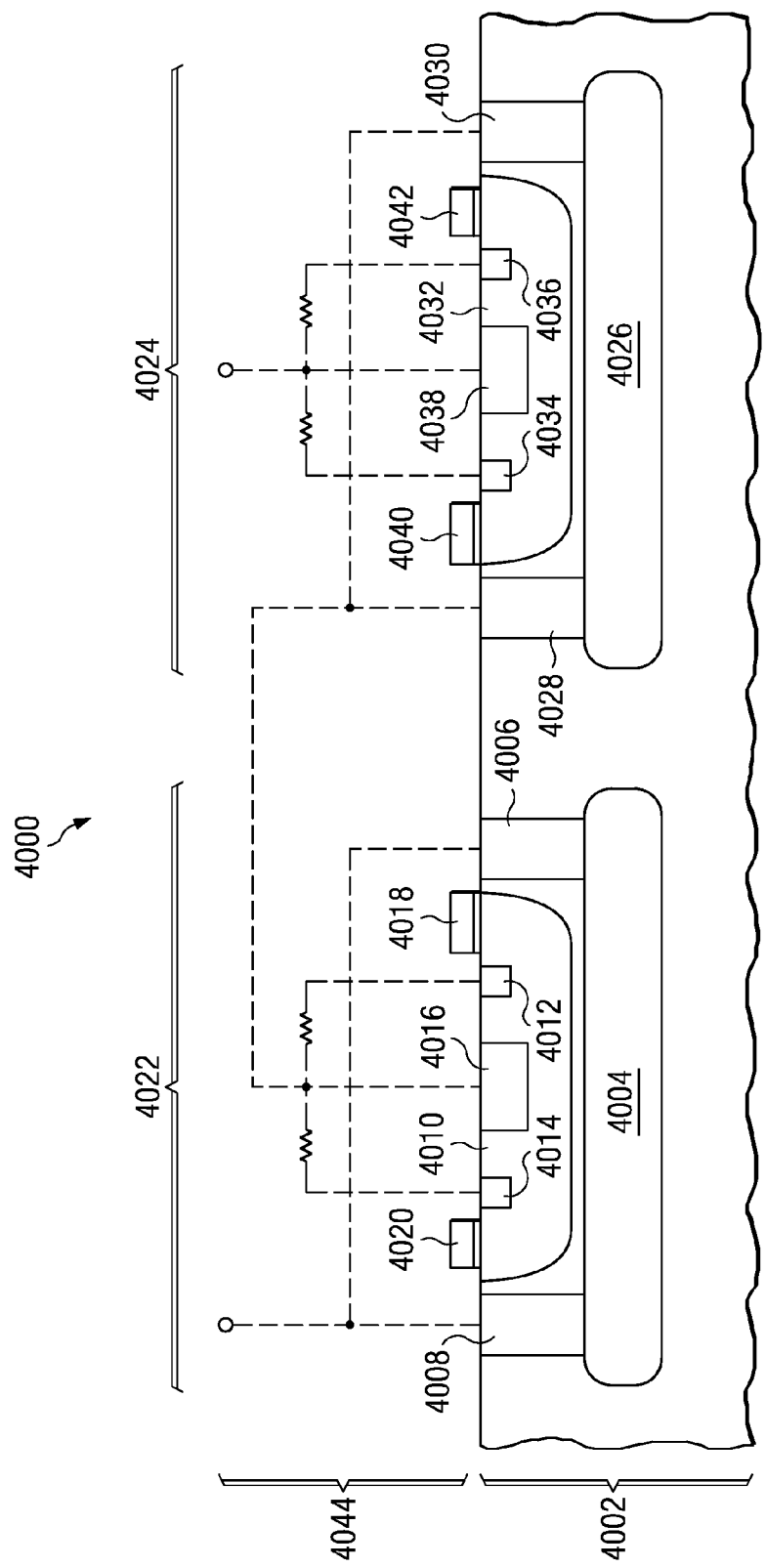
FIG. 4 is a cross-section of an integrated circuit containing a stacked bipolar transistor formed according to a fourth embodiment.

FIG. 4 is a cross-section of an integrated circuit containing a stacked bipolar transistor formed according to a fourth embodiment. The integrated circuit 4000 is formed in and on a semiconductor substrate 4002, as described in reference to FIG. 1A. An optional first buried collector layer 4004 may be formed in the substrate 4002 as described in reference to FIG. 1A. A first collector right vertical member 4006 and a first collector left vertical member 4008 are formed in the substrate 4002 and extend from a top surface of the substrate 4002 to the first buried collector layer 4004 if present. The first collector right vertical member 4006 and the first collector left vertical member 4008 are formed as described in reference to FIG. 1B. An optional first well 4010 may be formed between the first collector right vertical member 4006 and the first collector left vertical member 4008, above the first buried collector layer 4004 and extending to the top surface of the substrate 4002. A conductivity type of the first well 4010 if formed is opposite from a conductivity type of the first collector right vertical member 4006 and the first collector left vertical member 4008.

A first base right diffused region 4012 and a first base left diffused region 4014 are formed in the substrate 4002 between the first collector right vertical member 4006 and the first collector left vertical member 4008, using processes as described in reference to FIG. 1C. The first base right diffused region 4012 is located closer to the first collector right vertical member 4006 than to the first collector left vertical member 4008. The first base left diffused region 4014 is located closer to the first collector left vertical member 4008 than to the first collector right vertical member 4006. In the instant embodiment, a lateral separation between the first base right diffused region 4012 and the first collector right vertical member 4006 is substantially equal to a lateral separation between the first base left diffused region 4014 and the first collector left vertical member 4008.

A first emitter diffused region 4016 is formed in the substrate 4002 extending to the top surface of the substrate 4002 between the first base right diffused region 4012 and the first base left diffused region 4014. In the instant embodiment, the first emitter diffused region 4016 is located substantially equidistant from the first base right diffused region 4012 and the first base left diffused region 4014.

A first transistor right field plate 4018 is formed over the substrate 4002 between the first base right diffused region 4012 and the first collector right vertical member 4006. A first transistor left field plate 4020 is formed over the substrate 4002 between the first base left diffused region 4014 and the first collector left vertical member 4008. The first transistor field plates 4018 and 4020 may be formed of polycrystalline silicon, commonly known as polysilicon, a combination of polysilicon and metal silicide, a metal such as tungsten, titanium nitride, aluminum or copper, or other electrically conductive material. The first transistor field plates 4018 and 4020 may be formed over a dielectric layer to provide electrical isolation from the substrate 4002.

The optional first buried collector layer 4004 if present, the first collector right vertical member 4006, the first collector left vertical member 4008, the first base right diffused region 4012, the first base left diffused region 4014, the first emitter diffused region 4016, the first transistor right field plate 4018 and the first transistor left field plate 4020 are included in a first bipolar transistor 4022 of the stacked bipolar transistor. The optional first buried collector layer 4004 if present, the first collector right vertical member 4006 and the first collector left vertical member 4008 are included in a collector of the first bipolar transistor 4022. The first base right diffused region 4012 and the first base left diffused region 4014 are included in a base of the first bipolar transistor 4022. The first emitter diffused region 4016 is included in an emitter of the first bipolar transistor 4022.

The first transistor right field plate 4018 and the first transistor left field plate 4020 are formed so that collector-base breakdown in the first bipolar transistor 4022 may be induced under the first transistor right field plate 4018. The configuration of the first collector right vertical member 4006, the first base right diffused region 4012 and the first transistor right field plate 4018 is a breakdown inducing feature of the first bipolar transistor. In one realization of the instant embodiment, a length of the first transistor right field plate 4018 may be greater than a length of the first transistor left field plate 4020. In one realization of the instant embodiment, a distance of the first transistor right field plate 4018 from the first collector right vertical member 4006 may be less than a distance of the first transistor left field plate 4020 from the first collector left vertical member 4008.

A second bipolar transistor 4024 of the stacked bipolar transistor includes a second buried collector layer 4026 if the optional first buried collector layer 4004 is present, and includes a second collector left vertical member 4028, a second collector right vertical member 4030, an optional second well 4032, a second base left diffused region 4034, a second base right diffused region 4036, a second emitter diffused region 4038, a second transistor left field plate 4040 and a second transistor right field plate 4042.

The second buried collector layer 4026 if present, second collector left vertical member 4028 and the second collector right vertical member 4030 are included in a collector of the second bipolar transistor 4024. The second base left diffused region 4034 and the second base right diffused region 4036 are included in a base of the second bipolar transistor 4024. The second emitter diffused region 4038 is included in an emitter of the second bipolar transistor 4024.

The second transistor left field plate 4040 and the second transistor right field plate 4042 are located so as to have reflection symmetry with respect to the first transistor right field plate 4018 and the first transistor left field plate 4020, respectively. Similarly, the second base left diffused region 4034 and the second base right diffused region 4036 are located so as to have reflection symmetry with respect to the first base right diffused region 4012 and the first base left diffused region 4014, respectively. A spatial configuration of the second base left diffused region 4034, the second transistor left field plate 4040 and the second collector left vertical member 4028 has reflection symmetry to a spatial configuration of the first base right diffused region 4012, the first transistor right field plate 4018 and the first collector right vertical member 4006. A plane of the reflection symmetry is perpendicular to the top surface of the substrate 4002 and perpendicular to the plane of FIG. 4. Forming the second base left diffused region 4034, the second transistor left field plate 4040 and the second collector left vertical member 4028 to have a spatial configuration with reflection symmetry of the spatial configuration of the first base right diffused region 4012, the first transistor right field plate 4018 and the first collector right vertical member 4006 may induce collector-base breakdown in the second bipolar transistor 4024 under the second transistor left field plate 4040. The configuration of the second collector left vertical member 4028, the second base left diffused region 4034 and the second transistor left field plate 4040 is a breakdown inducing feature of the second bipolar transistor. The first bipolar transistor 4022 and the second bipolar transistor 4024 may be electrically coupled in series by interconnect elements 4044 as described in reference to FIG. 1E.

A first collector-base breakdown voltage of the collector-base breakdown between the first base right diffused region 4012 and the first collector right vertical member 4006 may be a function of the spatial configuration of the first base right diffused region 4012, the first transistor right field plate 4018 and the first collector right vertical member 4006. Instances of the spatial configuration of the first base right diffused region 4012, the first transistor right field plate 4018 and the first collector right vertical member 4006 may include misalignments in instances of the stacked bipolar transistor. Similarly, a second collector-base breakdown voltage of the collector-base breakdown between the second base left diffused region 4034 and the second collector left vertical member 4028 may be a function of the spatial configuration of the second base left diffused region 4034, the second transistor left field plate 4040 and the second collector left vertical member 4028, such that instances of the misalignments which increase the first collector-base breakdown voltage may decrease the second collector-base breakdown voltage, and vice versa. A collector-base breakdown voltage of the stacked bipolar transistor is substantially a sum of the first collector-base breakdown voltage and the second collector-base breakdown voltage. Thus, forming the breakdown inducing feature of the second bipolar transistor 4024 to have reflection symmetry with respect to the breakdown inducing feature of the first bipolar transistor 4022 may reduce a sensitivity of the collector-base breakdown voltage of the stacked bipolar transistor to the misalignments.

It will be recognized that a stacked bipolar transistor of opposite polarity to that described in reference to FIG. 4 may be formed by appropriate changes in polarities of dopants and conductivity types. A stacked bipolar transistor of opposite polarity may have a reduced sensitivity of a collector-base breakdown voltage of the stacked bipolar transistor to misalignments, as described in reference to FIG. 4.

In one realization of the instant embodiment, the first collector left vertical member 4008 and the second collector right vertical member 4030 may be omitted. In one realization of the instant embodiment, the first transistor left field plate 4020 and the second transistor right field plate 4042 may be omitted. In one realization of the instant embodiment, the first base left diffused region 4014 and the second base right diffused region 4036 may be omitted.

Figure 5:
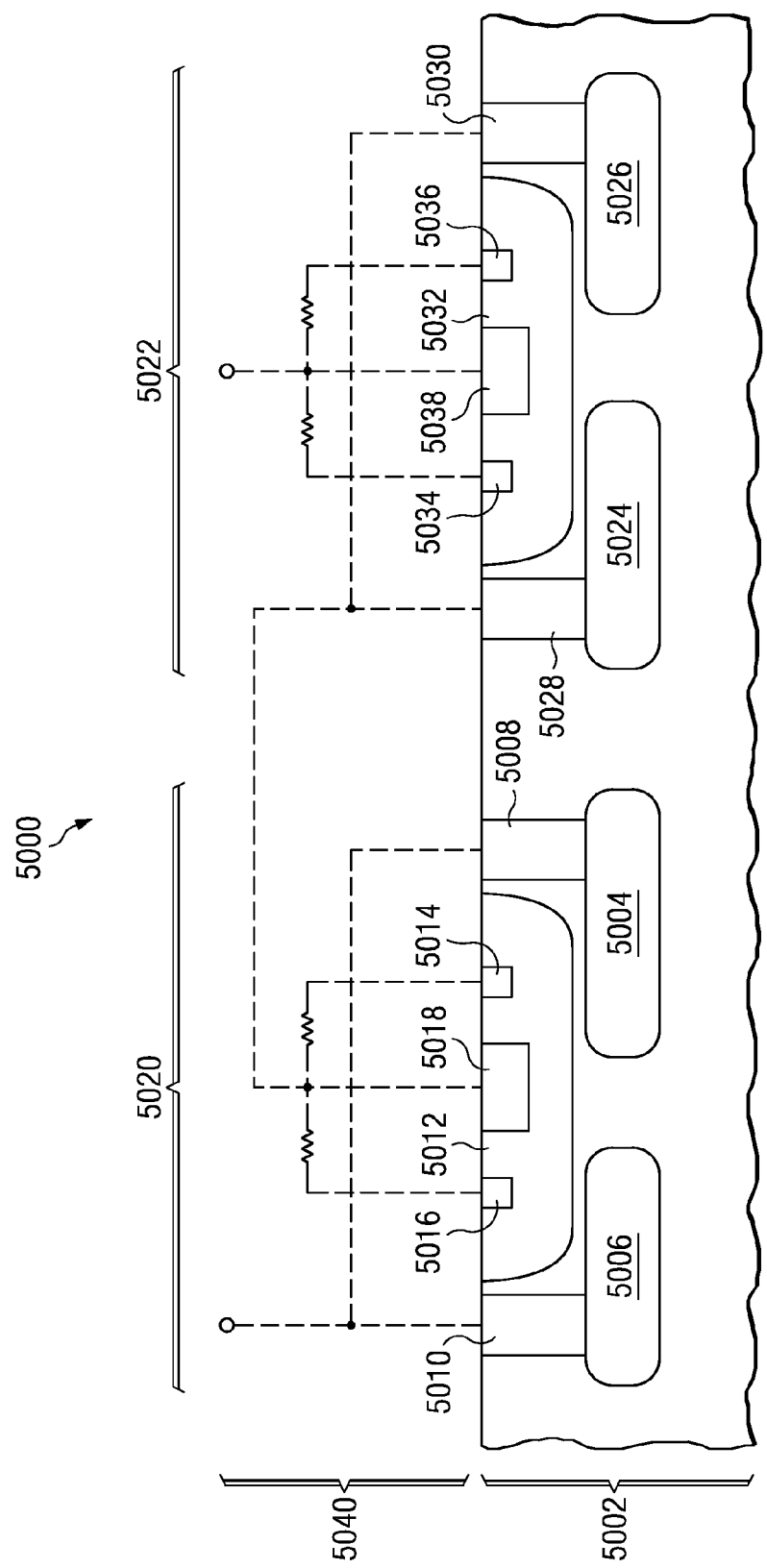
FIG. 5 is a cross-section of an integrated circuit containing a stacked bipolar transistor formed according to a fifth embodiment.

FIG. 5 is a cross-section of an integrated circuit containing a stacked bipolar transistor formed according to a fifth embodiment. The integrated circuit 5000 is formed in and on a semiconductor substrate 5002, as described in reference to FIG. 1A. A first buried collector right lobe 5004 and a first buried collector left lobe 5006 are formed in the substrate 5002 as described in reference to the first buried collector layer 1004 in FIG. 1A. A first collector right vertical member 5008 and a first collector left vertical member 5010 are formed in the substrate 5002 and extend from a top surface of the substrate 5002 to the first buried collector right lobe 5004 and the first buried collector left lobe 5006, respectively. The first collector right vertical member 5008 and the first collector left vertical member 5010 are formed as described in reference to FIG. 1B. A first well 5012 is formed between the first collector right vertical member 5008 and the first collector left vertical member 5010, above the first buried collector right lobe 5004 and the first buried collector left lobe 5006, extending to the top surface of the substrate 5002. A conductivity type of the first well 5012 is opposite a conductivity type of the first buried collector right lobe 5004 and the first buried collector left lobe 5006.

A first base right diffused region 5014 and a first base left diffused region 5016 are formed in the substrate 5002 between the first collector right vertical member 5008 and the first collector left vertical member 5010, using processes as described in reference to FIG. 1C. The first base right diffused region 5014 is located closer to the first collector right vertical member 5008 than to the first collector left vertical member 5010. The first base left diffused region 5016 is located closer to the first collector left vertical member 5010 than to the first collector right vertical member 5008.

A first emitter diffused region 5018 is formed in the substrate 5002 extending to the top surface of the substrate 5002 between the first base right diffused region 5014 and the first base left diffused region 5016. In the instant embodiment, the first emitter diffused region 5018 is located substantially equidistant from the first base right diffused region 5014 and the first base left diffused region 5016. The first buried collector right lobe 5004, the first buried collector left lobe 5006, the first collector right vertical member 5008, the first collector left vertical member 5010, the first base right diffused region 5014, the first base left diffused region 5016 and the first emitter diffused region 5018 are included in a first bipolar transistor 5020 of the stacked bipolar transistor. The first buried collector right lobe 5004, the first buried collector left lobe 5006, the first collector right vertical member 5008 and the first collector left vertical member 5010 are included in a collector of the first bipolar transistor 5020. The first base right diffused region 5014 and the first base left diffused region 5016 are included in a base of the first bipolar transistor 5020. The first emitter diffused region 5018 is included in an emitter of the first bipolar transistor 5020. In the instant embodiment, an underlap of the first buried collector right lobe 5004 under the first base right diffused region 5014 is more than an underlap of the first buried collector left lobe 5006 under the first base left diffused region 5016.

A second bipolar transistor 5022 of the stacked bipolar transistor includes a second buried collector left lobe 5024, a second buried collector right lobe 5026, a second collector left vertical member 5028, a second collector right vertical member 5030, a second well 5032, a second base left diffused region 5034, a second base right diffused region 5036 and a second emitter diffused region 5038. The second buried collector left lobe 5024 and the second buried collector right lobe 5026, are formed so as to have reflection symmetry with respect to the first buried collector right lobe 5004 and the first buried collector left lobe 5006, respectively. Similarly, the second collector left vertical member 5028 and the second collector right vertical member 5030 are located so as to have reflection symmetry with respect to the first collector right vertical member 5008 and the first collector left vertical member 5010, respectively. Similarly, the second base left diffused region 5034 and the second base right diffused region 5036 are located so as to have reflection symmetry with respect to the first base right diffused region 5014 and the first base left diffused region 5016, respectively. A plane of the reflection symmetry is perpendicular to the top surface of the substrate 5002 and perpendicular to the plane of FIG. 2. An underlap of the second buried collector left lobe 5024 under the second base left diffused region 5034 is substantially equal to the underlap of the first buried collector right lobe 5004 under the first base right diffused region 5014.

The second buried collector left lobe 5024, the second buried collector right lobe 5026, the second collector left vertical member 5028 and the second collector right vertical member 5030 are included in a collector of the second bipolar transistor 5022. The second base left diffused region 5034 and the second base right diffused region 5036 are included in a base of the second bipolar transistor 5022. The second emitter diffused region 5038 is included in an emitter of the second bipolar transistor 5022. The first bipolar transistor 5020 and the second bipolar transistor 5022 may be electrically coupled in series by interconnect elements 5040 as described in reference to FIG. 1E.

Forming the first buried collector right lobe 5004, the first buried collector left lobe 5006, the first base right diffused region 5014 and the first base left diffused region 5016 so that the underlap of the first buried collector right lobe 5004 under the first base right diffused region 5014 is greater than the underlap of the first buried collector left lobe 5006 under the first base left diffused region 5016 may cause collector-base breakdown in the first bipolar transistor 5020 to be induced in a region between the first base right diffused region 5014 and the first buried collector right lobe 5004. The configuration of the first buried collector right lobe 5004 and the first base right diffused region 5014 is a breakdown inducing feature of the first bipolar transistor. Similarly, forming the second buried collector left lobe 5024, the second buried collector right lobe 5026, the second base left diffused region 5034 and the second base right diffused region 5036 so that the underlap of the second buried collector left lobe 5024 under the second base left diffused region 5034 is greater than the underlap of the second buried collector right lobe 5026 under the second base right diffused region 5036 may cause breakdown in the second bipolar transistor 5022 to be induced in a region between the second base left diffused region 5034 and the second buried collector left lobe 5024. The configuration of the second base left diffused region 5034 and the second buried collector left lobe 5024 is a breakdown inducing feature of the second bipolar transistor.

A first collector-base breakdown voltage of the collector-base breakdown between the first base right diffused region 5014 and the first buried collector right lobe 5004 may be an increasing function of the underlap of the first buried collector right lobe 5004 under the first base right diffused region 5014. Instances of the underlap of the first buried collector right lobe 5004 under the first base right diffused region 5014 may include misalignments in instances of the stacked bipolar transistor. Similarly, a second collector-base breakdown voltage of the collector-base breakdown between the second base left diffused region 5034 and the second buried collector left lobe 5024 may be an increasing function of the underlap of the second buried collector left lobe 5024 under the second base left diffused region 5034. The underlap of the second buried collector left lobe 5024 under the second base left diffused region 5034 may include the same misalignment as the underlap of the first buried collector right lobe 5004 under the first base right diffused region 5014. In such a case, a misalignment which increases the underlap of the first buried collector right lobe 5004 under the first base right diffused region 5014 and so increases the first collector-base breakdown voltage, may decrease the underlap of the second buried collector left lobe 5024 under the second base left diffused region 5034 by substantially a same distance and so may decrease the second collector-base breakdown voltage. A collector-base breakdown voltage of the stacked bipolar transistor is substantially a sum of the first collector-base breakdown voltage and the second collector-base breakdown voltage. Thus, forming the breakdown inducing feature of the second bipolar transistor 5022 to have reflection symmetry with respect to the breakdown inducing feature of the first bipolar transistor 5020 may reduce a sensitivity of the collector-base breakdown voltage of the stacked bipolar transistor to the misalignments.

It will be recognized that a stacked bipolar transistor of opposite polarity to that described in reference to FIG. 5 may be formed by appropriate changes in polarities of dopants and conductivity types. A stacked bipolar transistor of opposite polarity may have a reduced sensitivity of a collector-base breakdown voltage of the stacked bipolar transistor to misalignments, as described in reference to FIG. 5.

In one realization of the instant embodiment, the first collector left vertical member 5010 and the second collector right vertical member 5030 may be omitted. In one realization of the instant embodiment, the first buried collector left lobe 5006 and the second buried collector right lobe 5026 may be omitted. In one realization of the instant embodiment, the first base left diffused region 5016 and the second base right diffused region 5036 may be omitted.

Figure 6:
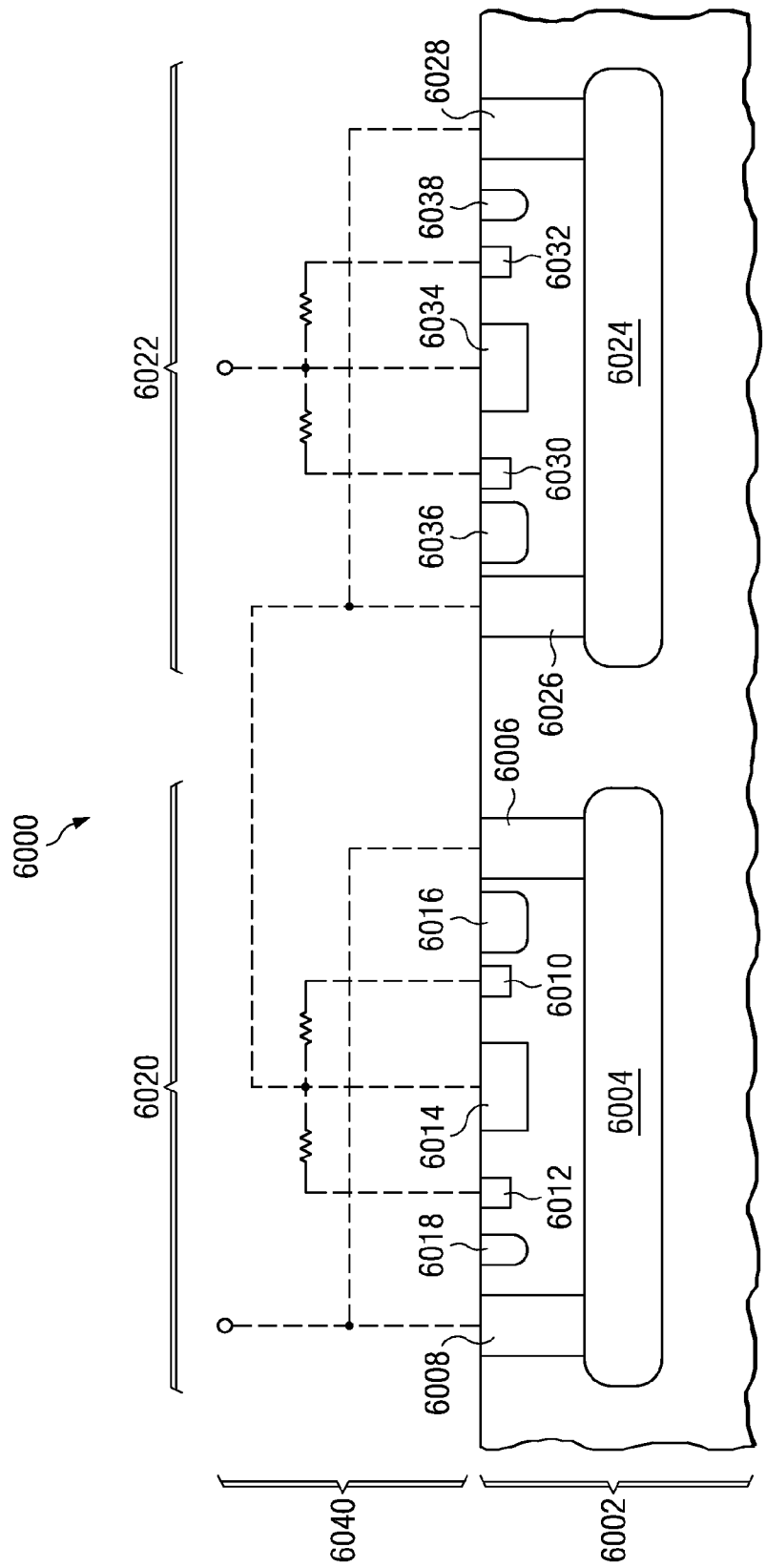
FIG. 6 is a cross-section of an integrated circuit containing a stacked bipolar transistor formed according to a sixth embodiment.

FIG. 6 is a cross-section of an integrated circuit containing a stacked bipolar transistor formed according to a sixth embodiment. The integrated circuit 6000 is formed in and on a semiconductor substrate 6002, as described in reference to FIG. 1A. An optional first buried collector layer 6004 may be formed in the substrate 6002 as described in reference to FIG. 1A. A first collector right vertical member 6006 and a first collector left vertical member 6008 are formed in the substrate 6002 and extend from a top surface of the substrate 6002 to the first buried collector layer 6004 if present. The first collector right vertical member 6006 and the first collector left vertical member 6008 are formed as described in reference to FIG. 1B.

A first base right diffused region 6010 and a first base left diffused region 6012 are formed in the substrate 6002 between the first collector right vertical member 6006 and the first collector left vertical member 6008, using processes as described in reference to FIG. 1C. The first base right diffused region 6010 is located closer to the first collector right vertical member 6006 than to the first collector left vertical member 6008. The first base left diffused region 6012 is located closer to the first collector left vertical member 6008 than to the first collector right vertical member 6006. In the instant embodiment, a lateral separation between the first base right diffused region 6010 and the first collector right vertical member 6006 is substantially equal to a lateral separation between the first base left diffused region 6012 and the first collector left vertical member 6008.

A first emitter diffused region 6014 is formed in the substrate 6002 extending to the top surface of the substrate 6002 between the first base right diffused region 6010 and the first base left diffused region 6012. In the instant embodiment, the first emitter diffused region 6014 is located substantially equidistant from the first base right diffused region 6010 and the first base left diffused region 6012.

A first transistor right implanted region 6016 having a same conductivity type as the first base right diffused region 6010 is formed in the substrate 6002 between the first base right diffused region 6010 and the first collector right vertical member 6006. A first transistor left implanted region 6018 having the same conductivity type as the first base left diffused region 6012 is formed in the substrate 6002 between the first base left diffused region 6012 and the first collector left vertical member 6008. The first transistor implanted regions 6016 and 6018 may be formed by ion implanting dopants followed by an anneal process.

The optional first buried collector layer 6004 if present, the first collector right vertical member 6006, the first collector left vertical member 6008, the first base right diffused region 6010, the first base left diffused region 6012, the first emitter diffused region 6014, the first transistor right implanted region 6016 and the first transistor left implanted region 6018 are included in a first bipolar transistor 6020 of the stacked bipolar transistor. The optional first buried collector layer 6004 if present, the first collector right vertical member 6006 and the first collector left vertical member 6008 are included in a collector of the first bipolar transistor 6020. The first base right diffused region 6010 and the first base left diffused region 6012 are included in a base of the first bipolar transistor 6020. The first emitter diffused region 6014 is included in an emitter of the first bipolar transistor 6020.

The first transistor right implanted region 6016 and the first transistor left implanted region 6018 are formed so that collector-base breakdown in the first bipolar transistor 6020 may be induced between the first collector right vertical member 6006 and the first base right diffused region 6010. The configuration of the first base right diffused region 6010, first transistor right implanted region 6016 and the first collector right vertical member 6006 is a breakdown inducing feature of the first bipolar transistor. In one realization of the instant embodiment, a length of the first transistor right implanted region 6016 may be greater than a length of the first transistor left implanted region 6018. In one realization of the instant embodiment, a doping density of the first transistor right implanted region 6016 may be greater than a doping density of the first transistor left implanted region 6018.

A second bipolar transistor 6022 of the stacked bipolar transistor includes a second buried collector layer 6024 if the optional first buried collector layer 6004 is present, and includes a second collector left vertical member 6026, a second collector right vertical member 6028, a second base left diffused region 6030, a second base right diffused region 6032, a second emitter diffused region 6034, a second transistor left implanted region 6036 having the same conductivity type as the second base left diffused region 6030 and a second transistor right implanted region 6038 having the same conductivity type as the second base right diffused region 6032. The second buried collector layer 6024 if present, the second collector left vertical member 6026 and the second collector right vertical member 6028 are included in a collector of the second bipolar transistor 6022. The second base left diffused region 6030 and the second base right diffused region 6032 are included in a base of the second bipolar transistor 6022. The second emitter diffused region 6034 is included in an emitter of the second bipolar transistor 6022. The second transistor left implanted region 6036 and the second transistor right implanted region 6038 are located so as to have reflection symmetry with respect to the first transistor right implanted region 6016 and the first transistor left implanted region 6018, respectively. Similarly, the second base left diffused region 6030 and the second base right diffused region 6032 are located so as to have reflection symmetry with respect to the first base right diffused region 6010 and the first base left diffused region 6012, respectively. A spatial configuration of the second base left diffused region 6030, the second transistor left implanted region 6036 and the second collector left vertical member 6026 has reflection symmetry to a spatial configuration of the first base right diffused region 6010, the first transistor right implanted region 6016 and the first collector right vertical member 6006. A plane of the reflection symmetry is perpendicular to the top surface of the substrate 6002 and perpendicular to the plane of FIG. 6. Forming the second base left diffused region 6030, the second transistor left implanted region 6036 and the second collector left vertical member 6026 to have a spatial configuration with reflection symmetry of the spatial configuration of the first base right diffused region 6010, the first transistor right implanted region 6016 and the first collector right vertical member 6006 may induce collector-base breakdown in the second bipolar transistor 6022 under the second transistor left implanted region 6036. The configuration of the second base left diffused region 6030, second transistor left implanted region 6036 and the second collector left vertical member 6026 is a breakdown inducing feature of the second bipolar transistor. The first bipolar transistor 6020 and the second bipolar transistor 6022 may be electrically coupled in series by interconnect elements 6040 as described in reference to FIG. 1E.

A first collector-base breakdown voltage of the collector-base breakdown between the first base right diffused region 6010 and the first collector right vertical member 6006 may be a function of the spatial configuration of the first base right diffused region 6010, the first transistor right implanted region 6016 and the first collector right vertical member 6006. Instances of the spatial configuration of the first base right diffused region 6010, the first transistor right implanted region 6016 and the first collector right vertical member 6006 may include misalignments in instances of the stacked bipolar transistor. Similarly, a second collector-base breakdown voltage of the collector-base breakdown between the second base left diffused region 6030 and the second collector left vertical member 6026 may be a function of the spatial configuration of the second base left diffused region 6030, the second transistor left implanted region 6036 and the second collector left vertical member 6026, such that instances of the misalignments which increase the first collector-base breakdown voltage may decrease the second collector-base breakdown voltage, and vice versa. A collector-base breakdown voltage of the stacked bipolar transistor is substantially a sum of the first collector-base breakdown voltage and the second collector-base breakdown voltage. Thus, forming the breakdown inducing feature of the second bipolar transistor 6022 to have reflection symmetry with respect to the breakdown inducing feature of the first bipolar transistor 6020 may reduce a sensitivity of the collector-base breakdown voltage of the stacked bipolar transistor to the misalignments.

It will be recognized that a stacked bipolar transistor of opposite polarity to that described in reference to FIG. 6 may be formed by appropriate changes in polarities of dopants and conductivity types. A stacked bipolar transistor of opposite polarity may have a reduced sensitivity of a collector-base breakdown voltage of the stacked bipolar transistor to misalignments, as described in reference to FIG. 6.

In one realization of the instant embodiment, the first collector left vertical member 6008 and the second collector right vertical member 6028 may be omitted. In one realization of the instant embodiment, the first transistor left implanted region 6018 and the second transistor right implanted region 6038 may be omitted. In one realization of the instant embodiment, the first base left diffused region 6012 and the second base right diffused region 6032 may be omitted.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   providing a semiconductor substrate;
   forming a stacked bipolar transistor, by a process including the steps:
      forming a first bipolar transistor, by a process further including the steps:
         forming a collector in said substrate, such that said collector of said first bipolar transistor has a first conductivity type;
         forming a base in said substrate proximate to said collector of said first bipolar transistor, such that said base of said first bipolar transistor is separated from said collector of said first bipolar transistor by a region of said substrate, and such that said base of said first bipolar transistor has a conductivity type opposite from said collector of said first bipolar transistor;
         forming an emitter in said substrate proximate to said base of said first bipolar transistor opposite from said collector of said first bipolar transistor, such that said emitter of said first bipolar transistor is separated from said base of said first bipolar transistor by a region of said substrate, and such that said emitter of said first bipolar transistor has a same conductivity type as said collector of said first bipolar transistor; and
         forming a breakdown inducing feature, such that said breakdown inducing feature of said first bipolar transistor includes said collector of said first bipolar transistor and said base of said first bipolar transistor;
      forming a second bipolar transistor, by a process further including the steps:
         forming a collector in said substrate, such that said collector of said second bipolar transistor has a same conductivity type as said collector of said first bipolar transistor;
         forming a base in said substrate proximate to said collector of said second bipolar transistor, such that said base of said second bipolar transistor is separated from said collector of said second bipolar transistor by a region of said substrate, and such that said base of said second bipolar transistor has a same conductivity type as said base of said first bipolar transistor;
         forming an emitter in said substrate proximate to said base of said second bipolar transistor opposite from said collector of said second bipolar transistor, such that said emitter of said second bipolar transistor is separated from said base of said second bipolar transistor by a region of said substrate, and such that said emitter of said second bipolar transistor has a same conductivity type as said collector of said second bipolar transistor; and
         forming a breakdown inducing feature, such that said breakdown inducing feature of said second bipolar transistor includes said collector of said second bipolar transistor and said base of said second bipolar transistor, and such that said breakdown inducing feature of said second bipolar transistor has reflection symmetry with respect to said breakdown inducing feature of said first bipolar transistor, in which a plane of said reflection symmetry is perpendicular to a top surface of said substrate; and
   forming interconnect elements, such that:
      said collector of said first bipolar transistor is coupled to a first circuit node;
      said emitter of said first bipolar transistor is coupled to said collector of said second bipolar transistor; and
      said emitter of said second bipolar transistor is coupled to a second circuit node.

2. The process of claim 1, in which:
said step of forming said collector of said first bipolar transistor further includes the step of forming a first collector right vertical member in said substrate and proximate to said emitter of said first bipolar transistor;
said step of forming said base of said first bipolar transistor further includes the step of forming a first base right diffused region in said substrate between said emitter of said first bipolar transistor and said first collector right vertical member;
said step of forming said breakdown inducing feature of said first bipolar transistor is performed such that said breakdown inducing feature of said first bipolar transistor further includes a region of said substrate between said first collector right vertical member and said first base right diffused region;
said step of forming said collector of said second bipolar transistor further includes the step of forming a second collector left vertical member in said substrate and proximate to said emitter of said second bipolar transistor;
said step of forming said base of said second bipolar transistor further includes the step of forming a second base left diffused region in said substrate between said emitter of said second bipolar transistor and said second collector left vertical member; and
said step of forming said breakdown inducing feature of said second bipolar transistor is performed such that said breakdown inducing feature of said second bipolar transistor further includes a region of said substrate between said second collector left vertical member and said second base left diffused region, and such that a configuration of said second collector left vertical member and said second base left diffused region has said reflection symmetry with respect to a configurations of said first collector right vertical member and said first base right diffused region.

3. The process of claim 2, in which:
said process of forming said collector of said first bipolar transistor further includes the step of forming a first buried collector layer in said substrate, such that a bottom surface of said first collector right vertical member contacts a top surface of said first buried collector layer; and
said process of forming said collector of said second bipolar transistor further includes the step of forming a second buried collector layer in said substrate, such that a bottom surface of said second collector left vertical member contacts a top surface of said second buried collector layer.

4. The process of claim 2, in which:
said process of forming said base of said first bipolar transistor further includes the step of forming a first base left diffused region in said substrate proximate to said emitter of said first bipolar transistor and opposite from said first base right diffused region;
said process of forming said collector of said first bipolar transistor further includes the steps:
    forming a first collector left vertical member in said substrate proximate to said first base left diffused region and opposite from said first collector right vertical member;
    forming a first buried collector right lobe in said substrate, such that a bottom surface of said first collector right vertical member contacts a top surface of said first buried collector right lobe; and
    forming a first buried collector left lobe in said substrate separate from said first buried collector right lobe, such that a bottom surface of said first collector left vertical member contacts a top surface of said first buried collector left lobe;
said process of forming said base of said second bipolar transistor further includes the step of forming a second base right diffused region in said substrate proximate to said emitter of said second bipolar transistor and opposite from said second base left diffused region; and
said process of forming said collector of said second bipolar transistor further includes the steps:
    forming a second collector right vertical member in said substrate proximate to said second base right diffused region and opposite from said second collector left vertical member;
    forming a second buried collector left lobe in said substrate, such that a bottom surface of said second collector left vertical member contacts a top surface of said second buried collector left lobe; and
    forming a second buried collector right lobe in said substrate separate from said second buried collector left lobe, such that a bottom surface of said second collector right vertical member contacts a top surface of said second buried collector right lobe.

5. The process of claim 1, in which:
said process of forming said collector of said first bipolar transistor includes the steps:
    forming a first collector right vertical member in said substrate proximate to said base of said first bipolar transistor; and
    forming a first collector right shallow well in said substrate extending to said top surface of said substrate, overlapping said first collector right vertical member, such that a lateral boundary of said first collector right shallow well on a side closest to said base of said first bipolar transistor extends past a corresponding lateral boundary of said first collector right vertical member;
said process of forming said base of said first bipolar transistor includes the step of forming a first base right diffused region in said substrate between said first collector right shallow well and said emitter of said first bipolar transistor;
said process of forming said breakdown inducing feature of said first bipolar transistor is performed such that aid breakdown inducing feature of said first bipolar transistor further includes a region of said substrate between said first base right diffused region and said first collector right shallow well;
said process of forming said collector of said second bipolar transistor includes the steps:
    forming a second collector left vertical member in said substrate proximate to said base of said second bipolar transistor; and
    forming a second collector left shallow well in said substrate extending to said top surface of said substrate, overlapping said second collector left vertical member, such that a lateral boundary of said second collector left shallow well on a side closest to said base of said second bipolar transistor extends past a corresponding lateral boundary of said second collector left vertical member;
said process of forming said base of said second bipolar transistor includes the step of forming a second base left diffused region formed in said substrate between said second collector left shallow well and said emitter of said second bipolar transistor; and said process of forming said breakdown inducing feature of said second bipolar transistor further is performed such that said breakdown inducing feature of said second bipolar transistor includes a region of said substrate between said second base left diffused region and said second collector left shallow well.

6. The process of claim 1, in which:

said process of forming said base of said first bipolar transistor includes the steps:
  forming a first base right diffused region in said substrate proximate to said emitter of said first bipolar transistor; and
  forming a first base left diffused region in said substrate proximate to said emitter of said first bipolar transistor and opposite from said first base right diffused region;

said process of forming said collector of said first bipolar transistor includes the steps:
  forming a first collector right vertical member in said substrate proximate to said first base right diffused region;
  forming a first collector left vertical member in said substrate proximate to said first base left diffused region and opposite from said first collector right vertical member;
  forming a first buried collector right lobe in said substrate, such that a bottom surface of said first collector right vertical member contacts a top surface of said first buried collector right lobe; and
  forming a first buried collector left lobe in said substrate separate from said first buried collector right lobe, such that a bottom surface of said first collector left vertical member contacts a top surface of said first buried collector left lobe;

said process of forming said breakdown inducing feature of said first bipolar transistor is performed such that said breakdown inducing feature of said first bipolar transistor further includes a region of said substrate between said first base right diffused region and said first buried collector right lobe;

said process of forming said base of said second bipolar transistor includes the steps:
  forming a second base left diffused region in said substrate proximate to said emitter of said second bipolar transistor; and
  forming a second base right diffused region in said substrate proximate to said emitter of said second bipolar transistor and opposite from said second base left diffused region;

said process of forming said collector of said second bipolar transistor includes the steps:
  forming a second collector left vertical member in said substrate proximate to said second base left diffused region;
  forming a second collector right vertical member in said substrate proximate to said second base right diffused region and opposite from said second collector left vertical member;
  forming a second buried collector left lobe in said substrate, such that a bottom surface of said second collector left vertical member contacts a top surface of said second buried collector left lobe; and
  forming a second buried collector right lobe in said substrate separate from said second buried collector left lobe, such that a bottom surface of said second collector right vertical member contacts a top surface of said second buried collector right lobe; and said process of forming said breakdown inducing feature of said second bipolar transistor is performed such that said breakdown inducing feature of said second bipolar transistor further includes a region of said substrate between said second base left diffused region and said second buried collector left lobe.

7. The process of claim 1, in which:

said process of forming said base of said first bipolar transistor includes the steps:
  forming a first base right diffused region in said substrate proximate to said emitter of said first bipolar transistor; and
  forming a first base left diffused region in said substrate proximate to said emitter of said first bipolar transistor and opposite from said first base right diffused region;

said process of forming said collector of said first bipolar transistor includes the steps:
  forming a first collector right vertical member in said substrate proximate to said first base right diffused region; and
  forming a first collector left vertical member in said substrate proximate to said first base left diffused region and opposite from said first collector right vertical member;

said process of forming said first bipolar transistor further includes the steps:
  forming a first transistor right field plate over said substrate between said first base right diffused region and said first collector right vertical member; and
  forming a first transistor left field plate over said substrate between said first base left diffused region and said first collector left vertical member;

said process of forming said breakdown inducing feature of said first bipolar transistor further is performed such that said breakdown inducing feature of said first bipolar transistor includes said first transistor right field plate and a region of said substrate under said first transistor right field plate;

said process of forming said base of said second bipolar transistor includes the steps:
  forming a second base left diffused region in said substrate proximate to said emitter of said second bipolar transistor; and
  forming a second base right diffused region in said substrate proximate to said emitter of said second bipolar transistor and opposite from said second base left diffused region;

said process of forming said collector of said second bipolar transistor includes the steps:
  forming a second collector left vertical member in said substrate proximate to said second base left diffused region; and
  forming a second collector right vertical member in said substrate proximate to said second base right diffused region and opposite from said second collector left vertical member;

said process of forming said second bipolar transistor further includes the steps:
  forming a second transistor left field plate over said substrate between said second base left diffused region and said second collector left vertical member; and
  forming a second transistor right field plate over said substrate between said second base right diffused region and said second collector right vertical member; and said process of forming said breakdown inducing feature of said second bipolar transistor is performed such that said breakdown inducing feature of said second bipolar transistor further includes said second transistor left field plate and a region of said substrate under said second transistor left field plate.

8. The process of claim 1, in which:
said process of forming said base of said first bipolar transistor includes the steps:
   forming a first base right diffused region in said substrate proximate to said emitter of said first bipolar transistor; and
   forming a first base left diffused region in said substrate proximate to said emitter of said first bipolar transistor and opposite from said first base right diffused region;
said process of forming said collector of said first bipolar transistor includes the steps:
   forming a first collector right vertical member in said substrate proximate to said first base right diffused region; and
   forming a first collector left vertical member in said substrate proximate to said first base left diffused region and opposite from said first collector right vertical member;
said process of forming said first bipolar transistor further includes the steps:
   forming a first transistor right implanted region in said substrate between said first base right diffused region and said first collector right vertical member; and
   forming a first transistor left implanted region in said substrate between said first base left diffused region and said first collector left vertical member;
said process of forming said breakdown inducing feature of said first bipolar transistor is performed such that said breakdown inducing feature of said first bipolar transistor further includes said first transistor right implanted region;
said process of forming said base of said second bipolar transistor includes the steps:
   forming a second base left diffused region in said substrate proximate to said emitter of said second bipolar transistor; and
   forming a second base right diffused region in said substrate proximate to said emitter of said second bipolar transistor and opposite from said second base left diffused region;
said process of forming said collector of said second bipolar transistor includes the steps:
   forming a second collector left vertical member in said substrate proximate to said second base left diffused region; and
   forming a second collector right vertical member in said substrate proximate to said second base right diffused region and opposite from said second collector left vertical member;
said process of forming said second bipolar transistor further includes the steps:
   forming a second transistor left implanted region in said substrate between said second base left diffused region and said second collector left vertical member; and
   forming a second transistor right implanted region in said substrate between said second base right diffused region and said second collector right vertical member; and
said process of forming said breakdown inducing feature of said second bipolar transistor is performed such that said breakdown inducing feature of said second bipolar transistor further includes said second transistor left implanted region.

9. The process of claim 1, in which:
said process of forming said collector of said first bipolar transistor is performed such that said collector of said first bipolar transistor is n-type;
said process of forming said base of said first bipolar transistor is performed such that said base of said first bipolar transistor is p-type;
said process of forming said emitter of said first bipolar transistor is performed such that said emitter of said first bipolar transistor is n-type;
said process of forming said collector of said second bipolar transistor is performed such that said collector of said second bipolar transistor is n-type;
said process of forming said base of said second bipolar transistor is performed such that said base of said second bipolar transistor is p-type; and
said process of forming said emitter of said second bipolar transistor is performed such that said emitter of said second bipolar transistor is n-type.

10. The process of claim 1, in which:
said process of forming said collector of said first bipolar transistor is performed such that said collector of said first bipolar transistor is p-type;
said process of forming said base of said first bipolar transistor is performed such that said base of said first bipolar transistor is n-type;
said process of forming said emitter of said first bipolar transistor is performed such that said emitter of said first bipolar transistor is p-type;
said process of forming said collector of said second bipolar transistor is performed such that said collector of said second bipolar transistor is p-type;
said process of forming said base of said second bipolar transistor is performed such that said base of said second bipolar transistor is n-type; and
said process of forming said emitter of said second bipolar transistor is performed such that said emitter of said second bipolar transistor is p-type.

* * * * *